(12) United States Patent
Wu et al.

(10) Patent No.: US 11,532,748 B2
(45) Date of Patent: *Dec. 20, 2022

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Po-Chi Wu, Zhubei (TW); Chai-Wei Chang, New Taipei (TW); Jung-Jui Li, Hsinchu (TW); Ya-Lan Chang, Toufen Township (TW); Yi-Cheng Chao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 104 days.

This patent is subject to a terminal disclaimer.

(21) Appl. No.: 17/034,176

(22) Filed: Sep. 28, 2020

(65) Prior Publication Data

US 2021/0013338 A1   Jan. 14, 2021

Related U.S. Application Data

(60) Continuation of application No. 16/390,975, filed on Apr. 22, 2019, now Pat. No. 10,790,394, which is a
(Continued)

(51) Int. Cl.
*H01L 21/8238* (2006.01)
*H01L 29/78* (2006.01)
(Continued)

(52) U.S. Cl.
CPC .... *H01L 29/785* (2013.01); *H01L 21/823842* (2013.01); *H01L 29/0653* (2013.01); *H01L 29/66545* (2013.01); *H01L 29/66795* (2013.01)

(58) Field of Classification Search
CPC .......... H01L 29/785; H01L 21/823842; H01L 29/0653; H01L 29/66545; H01L 29/66795; H01L 29/4236
See application file for complete search history.

(56) References Cited

U.S. PATENT DOCUMENTS 5,969,398 A   10/1999   Murakami
6,753,215 B2   6/2004   Kasuya
(Continued)

FOREIGN PATENT DOCUMENTS

CN   104637819 A   5/2015
DE   102014222562 A1   5/2015
(Continued)

*Primary Examiner* — Bitew A Dinke
(74) *Attorney, Agent, or Firm* — Slater Matsil, LLP

(57) ABSTRACT

A method for forming a semiconductor device structure is provided. The method includes forming a dielectric layer over a substrate. The dielectric layer has a trench passing through the dielectric layer. The method includes forming a gate stack in the trench. The method includes performing a hydrogen-containing plasma process over the gate stack. The method includes removing a top portion of the gate stack to form a first recess surrounded by the gate stack and the dielectric layer. The method includes forming a cap layer in the first recess to fill the first recess.

20 Claims, 14 Drawing Sheets

Related U.S. Application Data continuation of application No. 15/601,576, filed on May 22, 2017, now Pat. No. 10,269,963, which is a division of application No. 14/851,485, filed on Sep. 11, 2015, now Pat. No. 9,660,084.

(60) Provisional application No. 62/187,625, filed on Jul. 1, 2015.

(51) Int. Cl.
*H01L 29/06* (2006.01)
*H01L 29/66* (2006.01)

(56) References Cited

U.S. PATENT DOCUMENTS

| | | | |
|---|---|---|---|
| 8,609,495 B2 | 12/2013 | Gan et al. | |
| 8,809,139 B2 | 8/2014 | Huang et al. | |
| 9,660,084 B2 * | 5/2017 | Wu | H01L 29/66795 |
| 10,269,963 B2 | 4/2019 | Wu et al. | |
| 2002/0153537 A1 * | 10/2002 | Segawa | H01L 21/76897 |
| | | | 257/E21.507 |
| 2003/0104706 A1 | 6/2003 | Mitsuhashi et al. | |
| 2003/0214043 A1 | 11/2003 | Saitoh et al. | |
| 2005/0062113 A1 * | 3/2005 | Watanabe | H01L 21/3003 |
| | | | 257/E21.654 |
| 2005/0170543 A1 * | 8/2005 | Sugawara | H01L 21/3003 |
| | | | 257/E21.654 |
| 2005/0245036 A1 | 11/2005 | Datta et al. | |
| 2005/0255684 A1 * | 11/2005 | Koldiaev | H01L 21/3003 |
| | | | 257/E21.654 |
| 2008/0124922 A1 | 5/2008 | Kawamura et al. | |
| 2009/0020831 A1 * | 1/2009 | Ramkumar | H01L 29/40117 |
| | | | 257/E29.345 |
| 2009/0087974 A1 | 4/2009 | Waite et al. | |
| 2009/0104741 A1 * | 4/2009 | Shin | H01L 21/823475 |
| | | | 257/E21.409 |
| 2010/0015766 A1 | 1/2010 | McMullan et al. | |
| 2010/0127335 A1 * | 5/2010 | Niimi | H01L 29/4966 |
| | | | 257/E21.177 |
| 2010/0171180 A1 * | 7/2010 | Zhang | H01L 29/4958 |
| | | | 438/230 |
| 2012/0012948 A1 | 1/2012 | Yeh et al. | |
| 2012/0214286 A1 * | 8/2012 | Lin | H01L 29/7833 |
| | | | 257/E21.409 |
| 2012/0248550 A1 * | 10/2012 | Huang | H01L 27/088 |
| | | | 257/E21.328 |
| 2012/0286372 A1 * | 11/2012 | Lavoie | H01L 21/3003 |
| | | | 257/E21.409 |
| 2013/0075784 A1 | 3/2013 | Ikeda | |
| 2013/0075827 A1 | 3/2013 | Lee et al. | |
| 2014/0061757 A1 | 3/2014 | Kim et al. | |
| 2014/0231885 A1 | 8/2014 | Xie et al. | |
| 2015/0061027 A1 | 3/2015 | Hong et al. | |
| 2015/0129962 A1 | 5/2015 | Xie et al. | |
| 2015/0270142 A1 | 9/2015 | Liu et al. | |
| 2015/0311081 A1 | 10/2015 | Xie et al. | |
| 2016/0020104 A1 * | 1/2016 | Lin | H01L 29/4966 |
| | | | 438/585 |
| 2016/0020118 A1 * | 1/2016 | Park | H01L 27/092 |
| | | | 438/592 |
| 2016/0079395 A1 * | 3/2016 | Sim | H01L 21/0234 |
| | | | 438/283 |
| 2016/0104644 A1 * | 4/2016 | Liu | H01L 21/823456 |
| | | | 257/401 |
| 2016/0104704 A1 | 4/2016 | Fang et al. | |
| 2016/0163601 A1 | 6/2016 | Xie et al. | |
| 2016/0204221 A1 | 7/2016 | He et al. | |
| 2016/0284817 A1 | 9/2016 | Basker et al. | |
| 2016/0308012 A1 | 10/2016 | Song et al. | |
| 2017/0033105 A1 | 2/2017 | Wang | |
| 2017/0162503 A1 * | 6/2017 | Olac-Vaw | H01L 29/66545 |
| 2017/0345912 A1 | 11/2017 | Kim | |

FOREIGN PATENT DOCUMENTS

| | | |
|---|---|---|
| KR | 20030089474 A | 11/2003 |
| KR | 20130033270 A | 4/2013 |
| KR | 20140104890 A | 8/2014 |
| TW | 200933820 A | 8/2009 |
| TW | 201413969 A | 4/2014 |
| WO | 2016028266 A1 | 2/2016 |

* cited by examiner

SEMICONDUCTOR DEVICE STRUCTURE AND METHOD FOR FORMING THE SAME

PRIORITY CLAIM AND CROSS-REFERENCE

This application is a continuation of U.S. patent application Ser. No. 16/390,975, filed on Apr. 22, 2019, entitled "Semiconductor Device Structure and Method for Forming the Same," which is a continuation of U.S. patent application Ser. No. 15/601,576, filed on May 22, 2017, now U.S. Pat. No. 10,269,963, issued on Apr. 23, 2019, entitled "Semiconductor Device Structure and Method for Forming the Same," which is a divisional of U.S. patent application Ser. No. 14/851,485, filed Sep. 11, 2015, now U.S. Pat. No. 9,660,084, issued on May 23, 2017, which claims the benefit of U.S. Provisional Application No. 62/187,625, filed on Jul. 1, 2015, the entireties of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
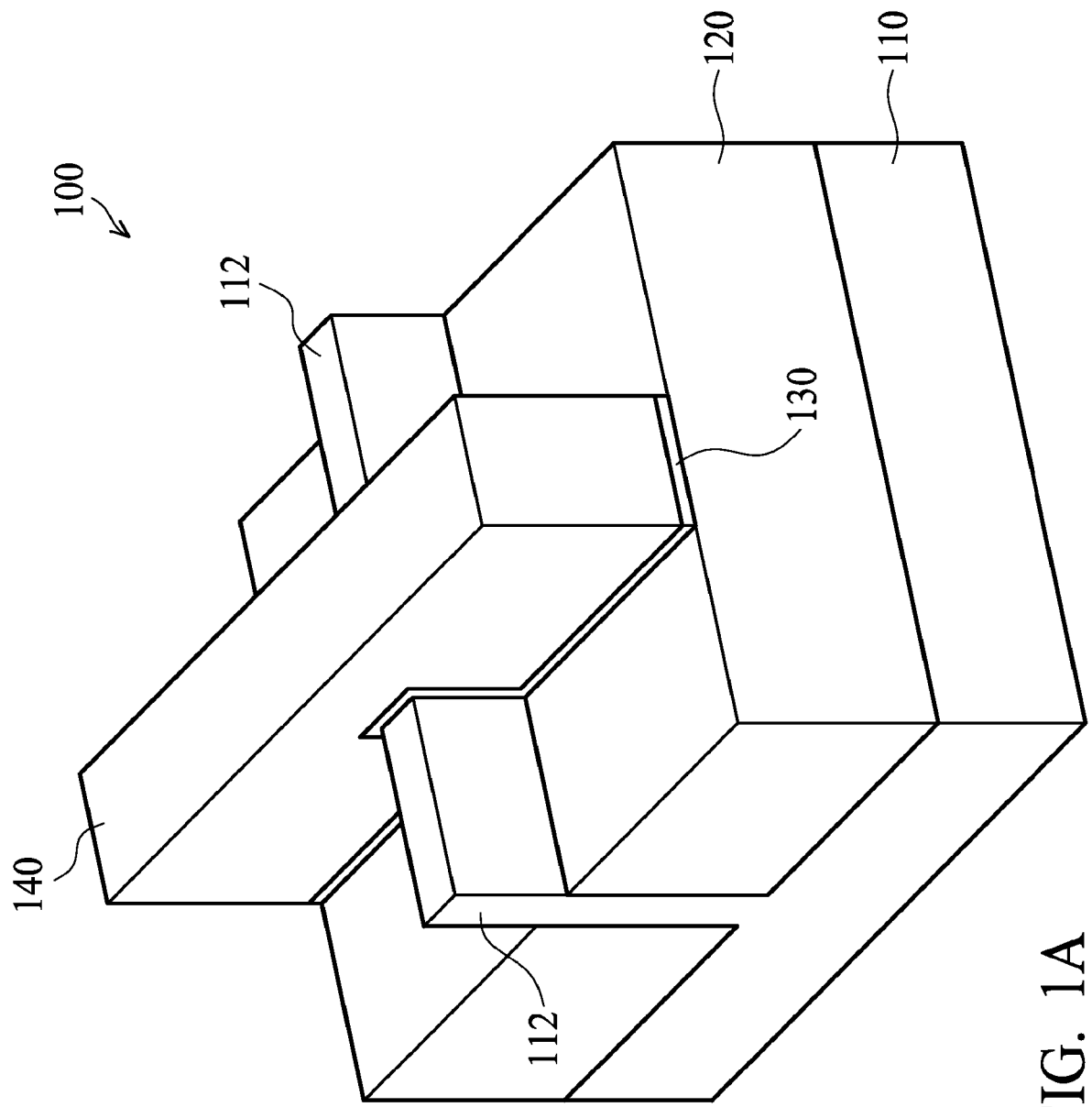
FIG. 1A is a perspective view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
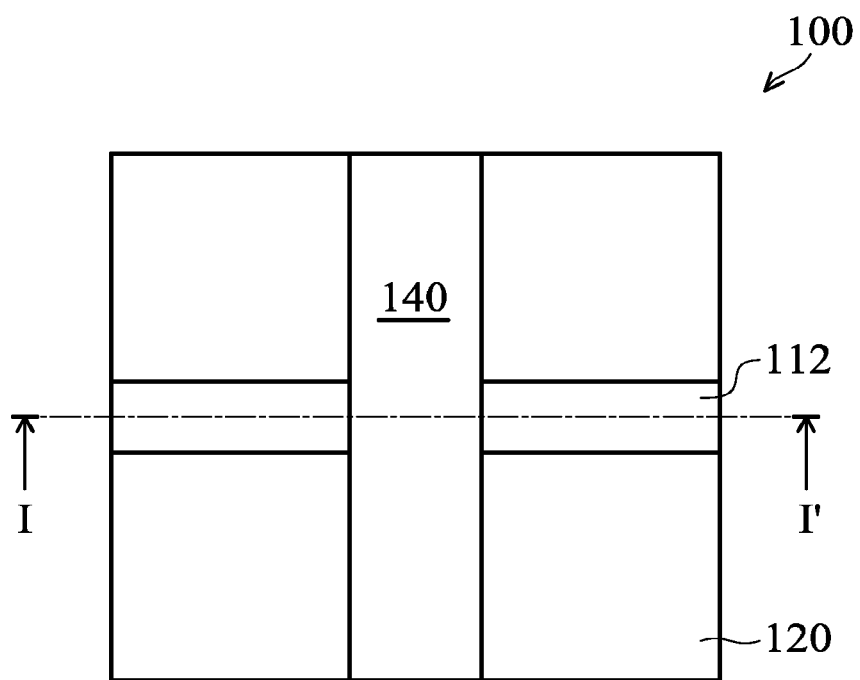
FIG. 1B is a top view of the semiconductor device structure of FIG. 1A, in accordance with some embodiments.
Figure 2A:
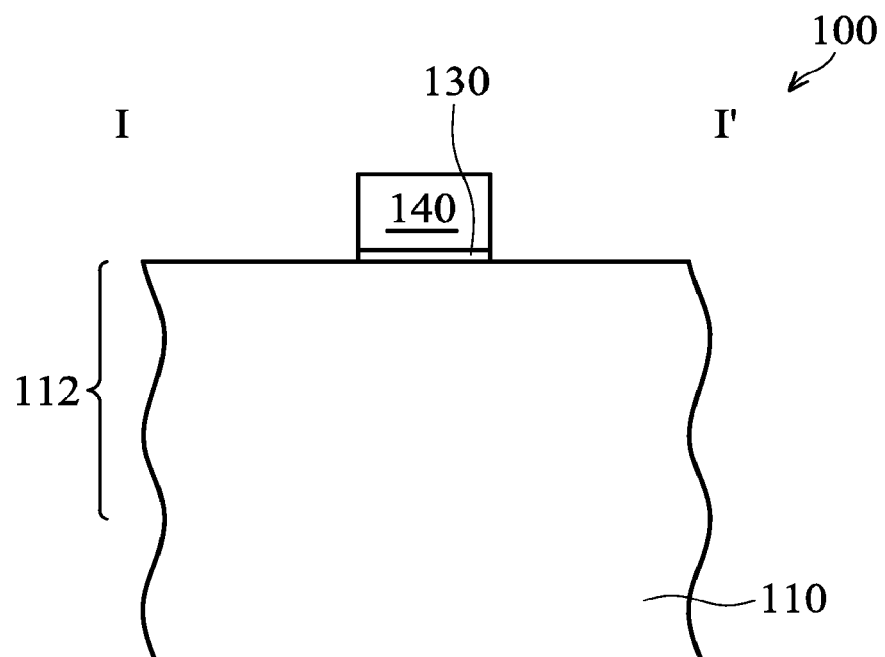
FIGS. 2A-2N are cross-sectional views of various stages of a process for forming a semiconductor device structure, in accordance with some embodiments.

FIG. 1A is a perspective view of a semiconductor device structure 100, in accordance with some embodiments. FIG. 1B is a top view of the semiconductor device structure 100 of FIG. 1A, in accordance with some embodiments. FIG. 2A is a cross-sectional view illustrating the semiconductor device structure 100 along a sectional line I-I' in FIG. 1B, in accordance with some embodiments.

As shown in FIGS. 1A, 1B, and 2A, a substrate 110 is provided, in accordance with some embodiments. The substrate 110 includes a semiconductor wafer (such as a silicon wafer) or a portion of a semiconductor wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In addition, the substrate 110 may include structures such as doped regions, interlayer dielectric (ILD) layers, and/or conductive features. Furthermore, the substrate 110 may further include single or multiple material layers. For example, the material layers may include a silicon layer, a dielectric layer, and/or a doped polysilicon layer.

As shown in FIGS. 1A, 1B, and 2A, the substrate 110 has a fin structure 112, in accordance with some embodiments. In some embodiments, the fin structure 112 is formed by patterning the substrate 110. For example, the formation of the fin structure 112 includes forming a patterned photoresist layer with openings (not shown) overlying the substrate 110; performing an etching process to remove a portion of the substrate 110 through openings; and removing the patterned photoresist layer. The etching process includes a reactive ion etch (RIE) or other suitable processes.

As shown in FIGS. 1A, 1B, and 2A, an isolation layer 120 is formed over the substrate 110 and adjacent to the fin structure 112, in accordance with some embodiments. The isolation layer 120 includes an insulating material, in accordance with some embodiments. The insulating material includes silicon oxide, silicon nitride, silicon oxynitride, another applicable material, or a combination thereof.

The formation of the isolation layer 120 includes forming an isolation material layer (not shown) over the substrate 110; and performing an etching back process on the isolation material layer to expose top portions of the fin structure 112, in accordance with some embodiments. The etching back process includes a dry etching process, in accordance with some embodiments.

As shown in FIGS. 1A, 1B, and 2A, a dummy gate dielectric layer 130 is formed over the fin structure 112, in accordance with some embodiments. The dummy gate dielectric layer 130 is made of silicon oxide, in accordance with some embodiments. The dummy gate 140 is formed over the dummy gate dielectric layer 130, in accordance with some embodiments. The dummy gate 140 is made of polysilicon, in accordance with some embodiments.

The formation of the dummy gate dielectric layer 130 and the dummy gate 140 includes depositing a dummy gate dielectric material layer (not shown) over the isolation layer 120 and the fin structure 112; depositing a dummy gate material layer (not shown) over the dummy gate dielectric material layer; and patterning the dummy gate material layer and the dummy gate dielectric material layer by a photolithography process and an etching process, in accordance with some embodiments.

The dummy gate dielectric material layer is deposited using a chemical vapor deposition process (CVD process), in accordance with some embodiments. The dummy gate material layer is deposited using a chemical vapor deposition process, in accordance with some embodiments.

Figure 2B:
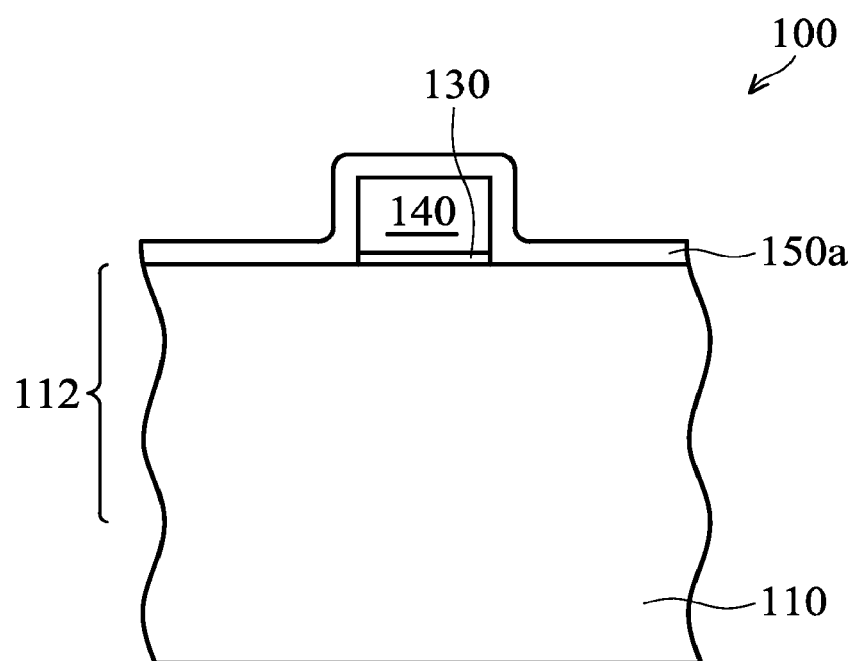
Figure 2C:
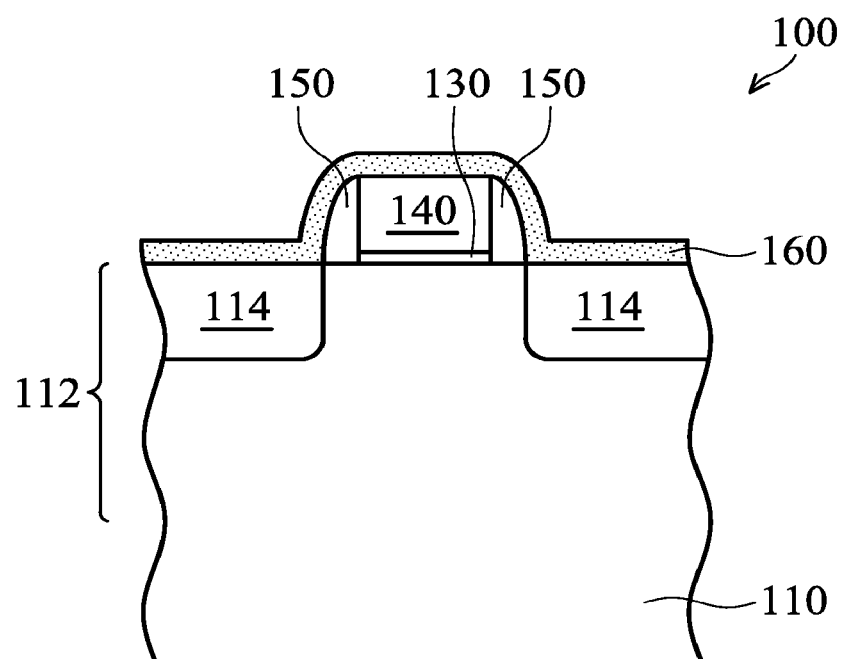
Figure 2D:
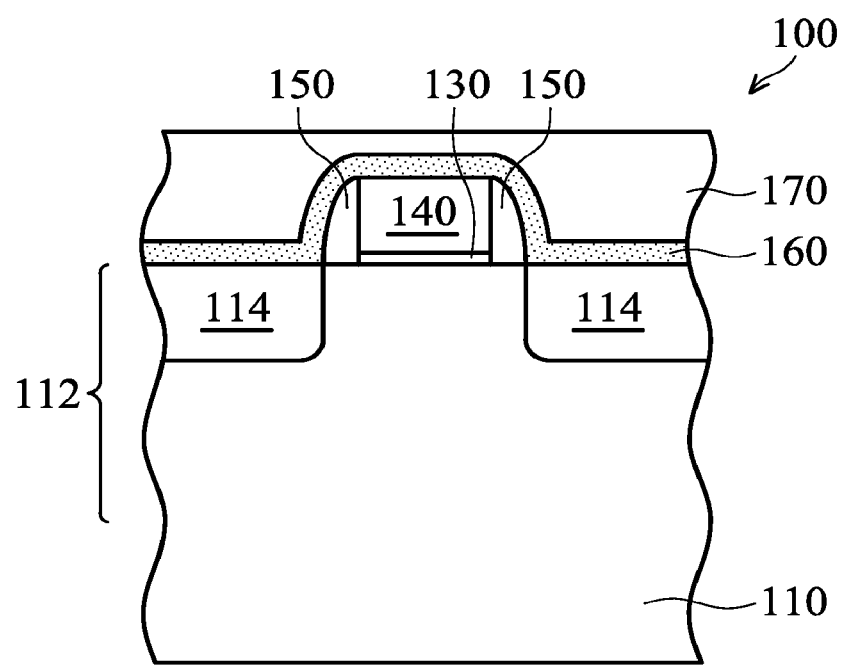
Figure 2E:
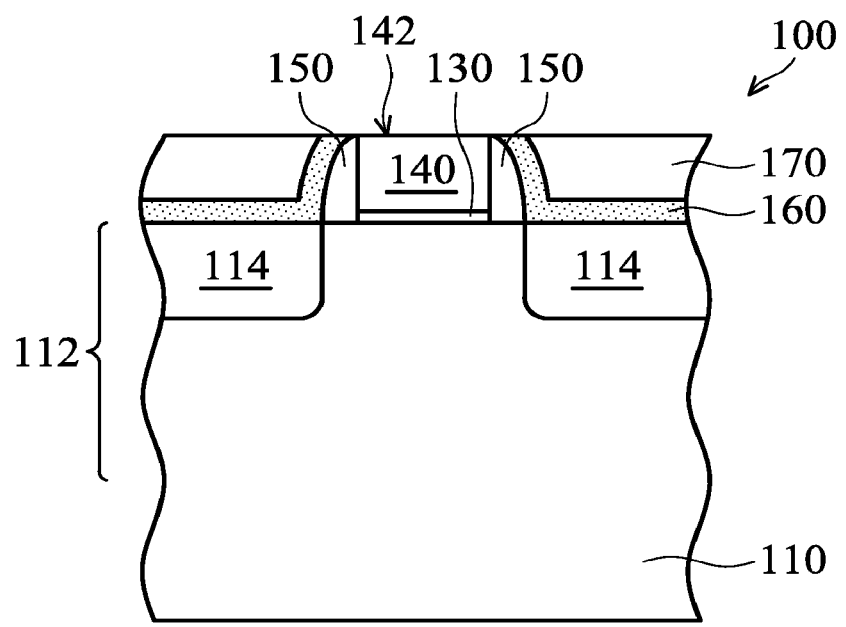
Figure 2F:
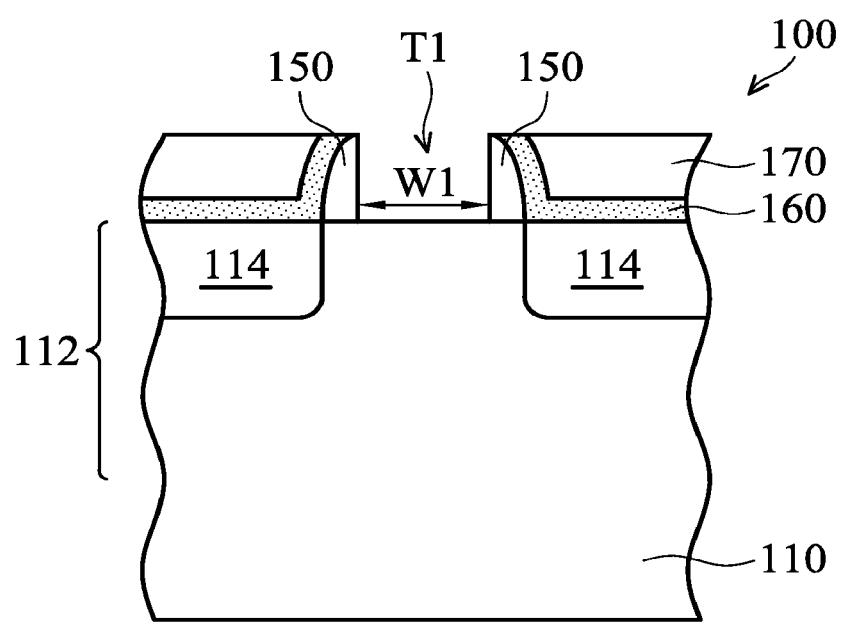
Figure 2G:
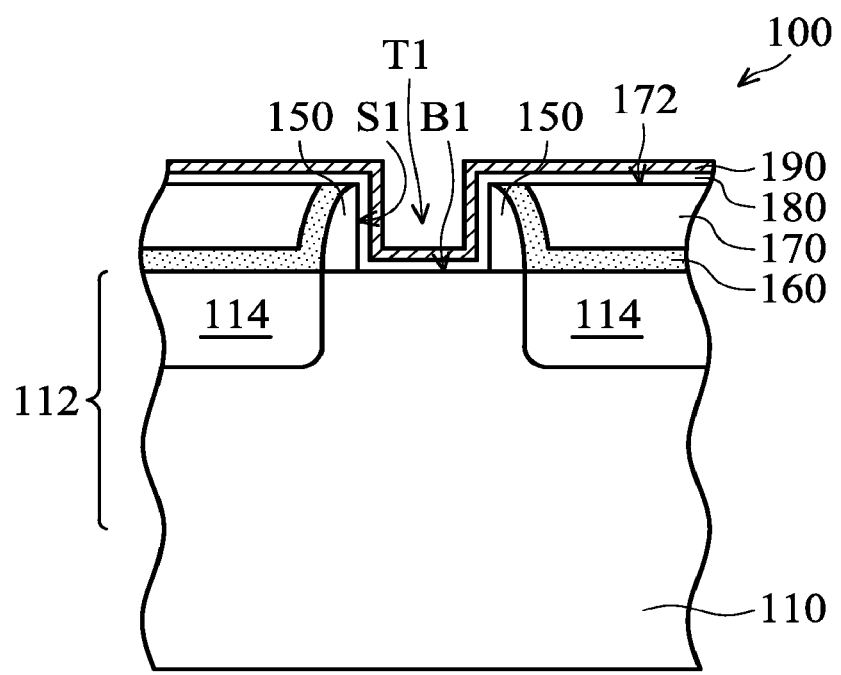
Figure 2H:
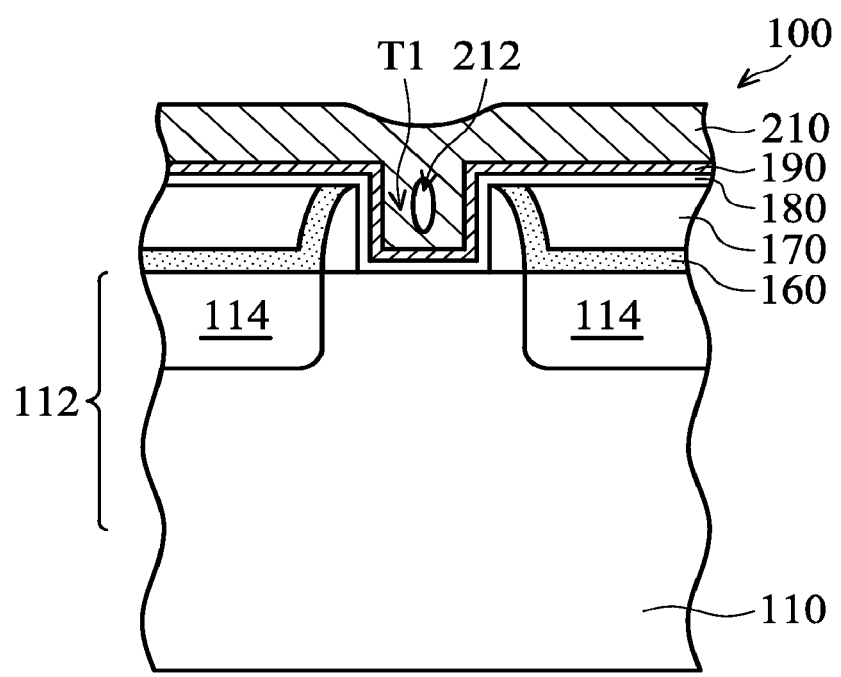
Figure 2I:
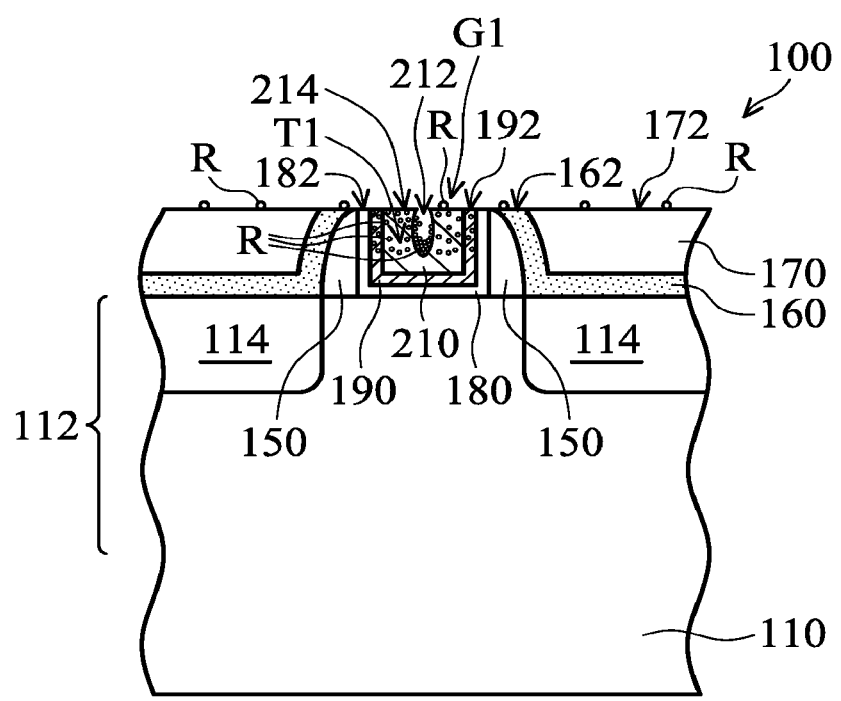
Figure 2J:
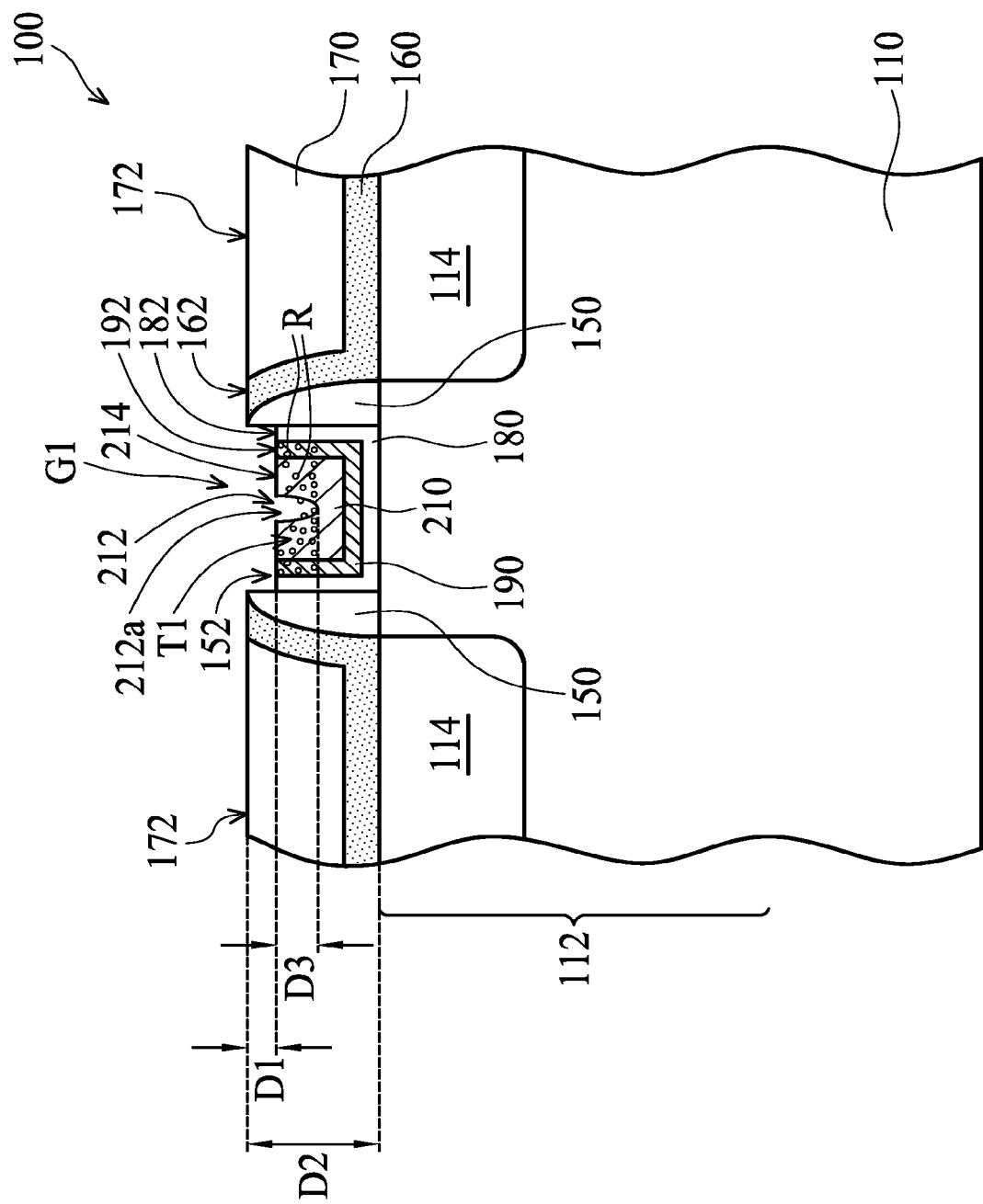
Figure 2K:
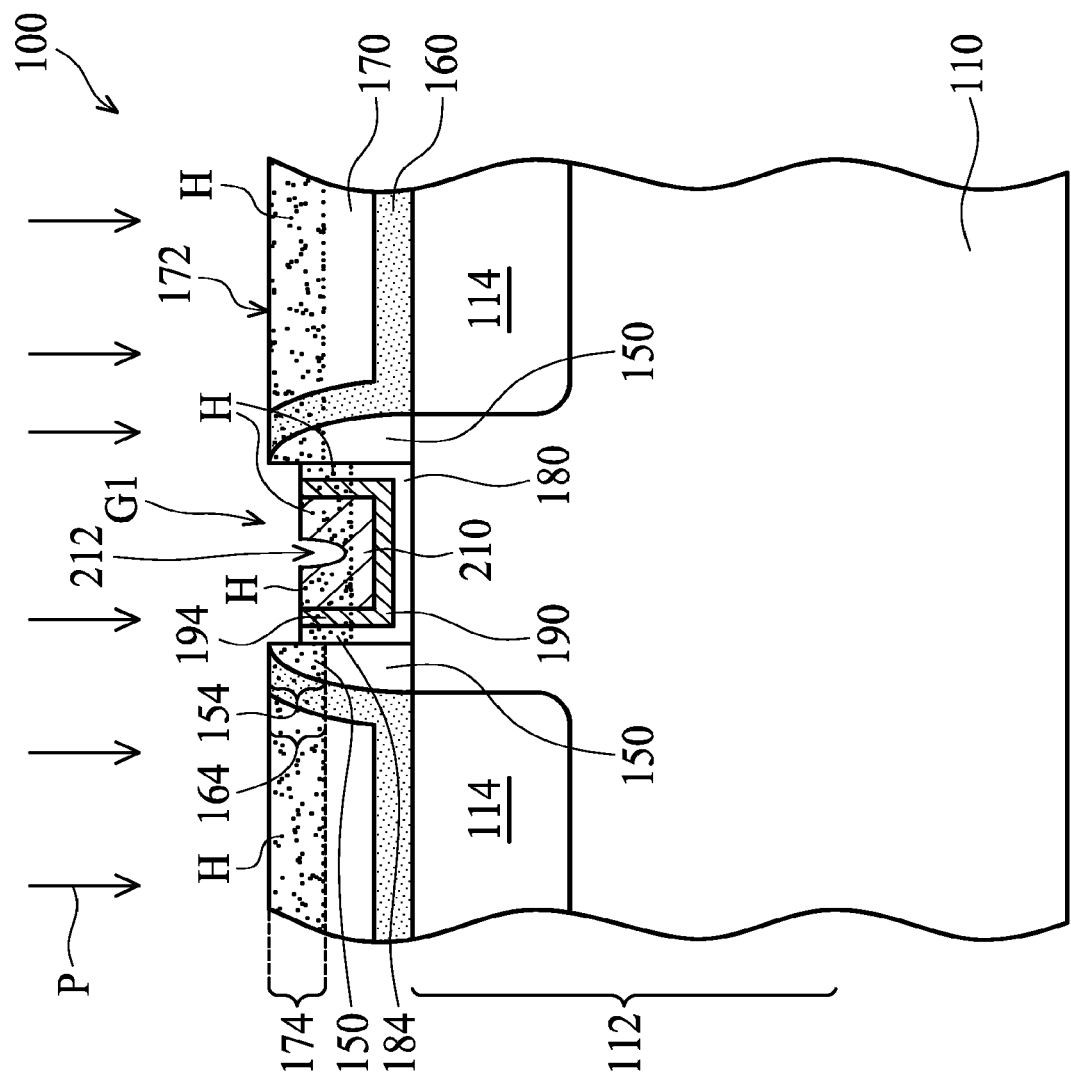
Figure 2L:
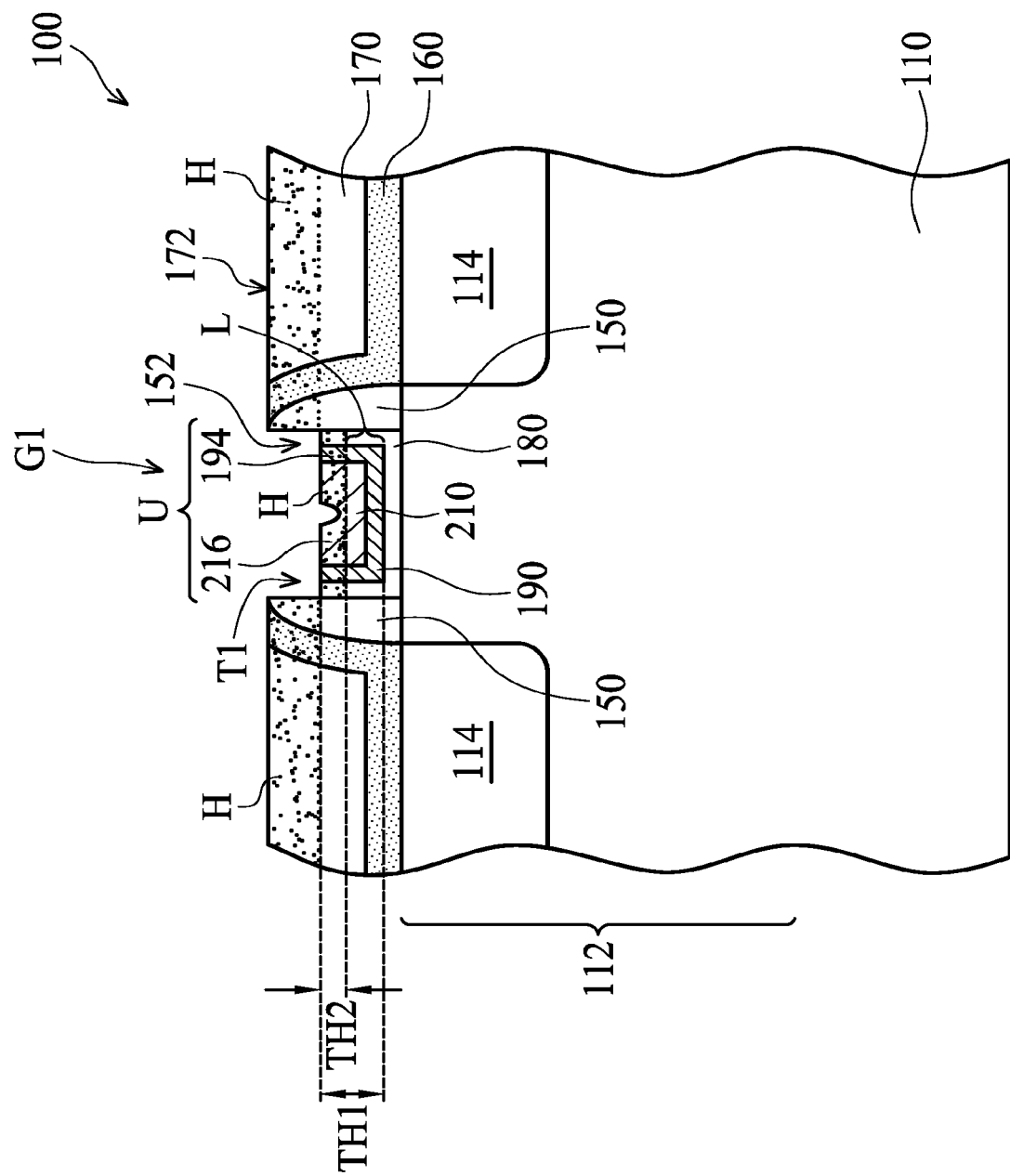
Figure 2M:
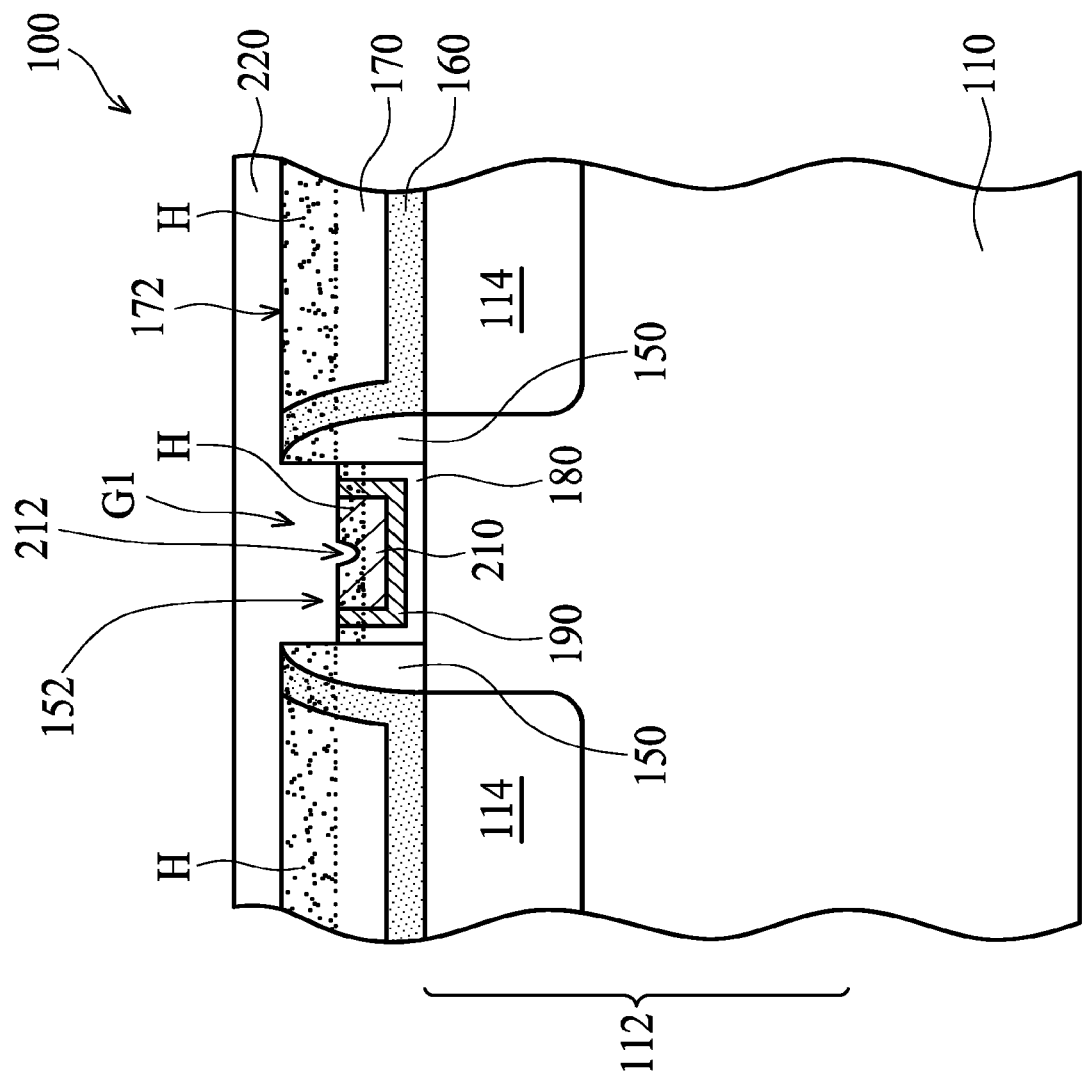
Figure 2N:
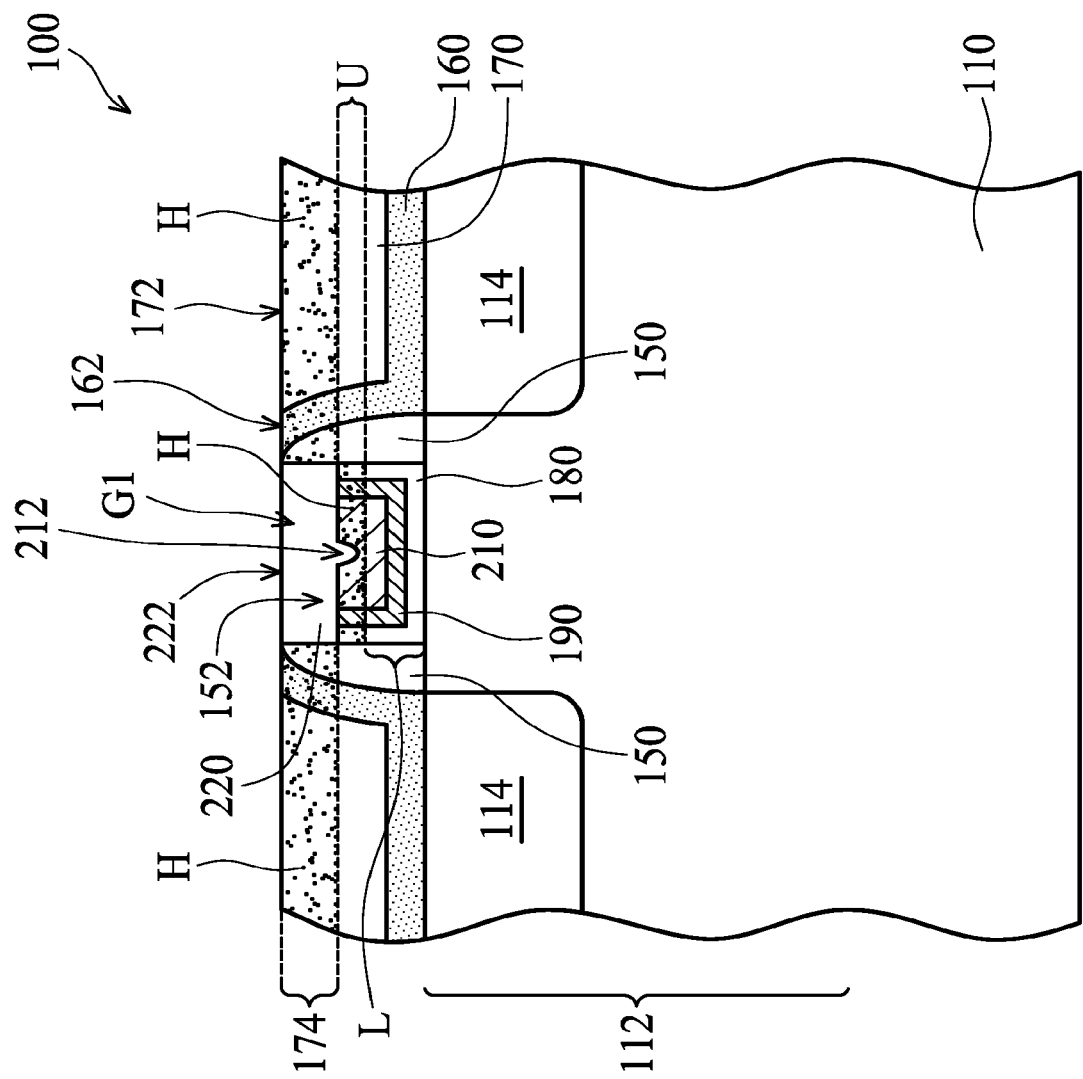
Figure 3:
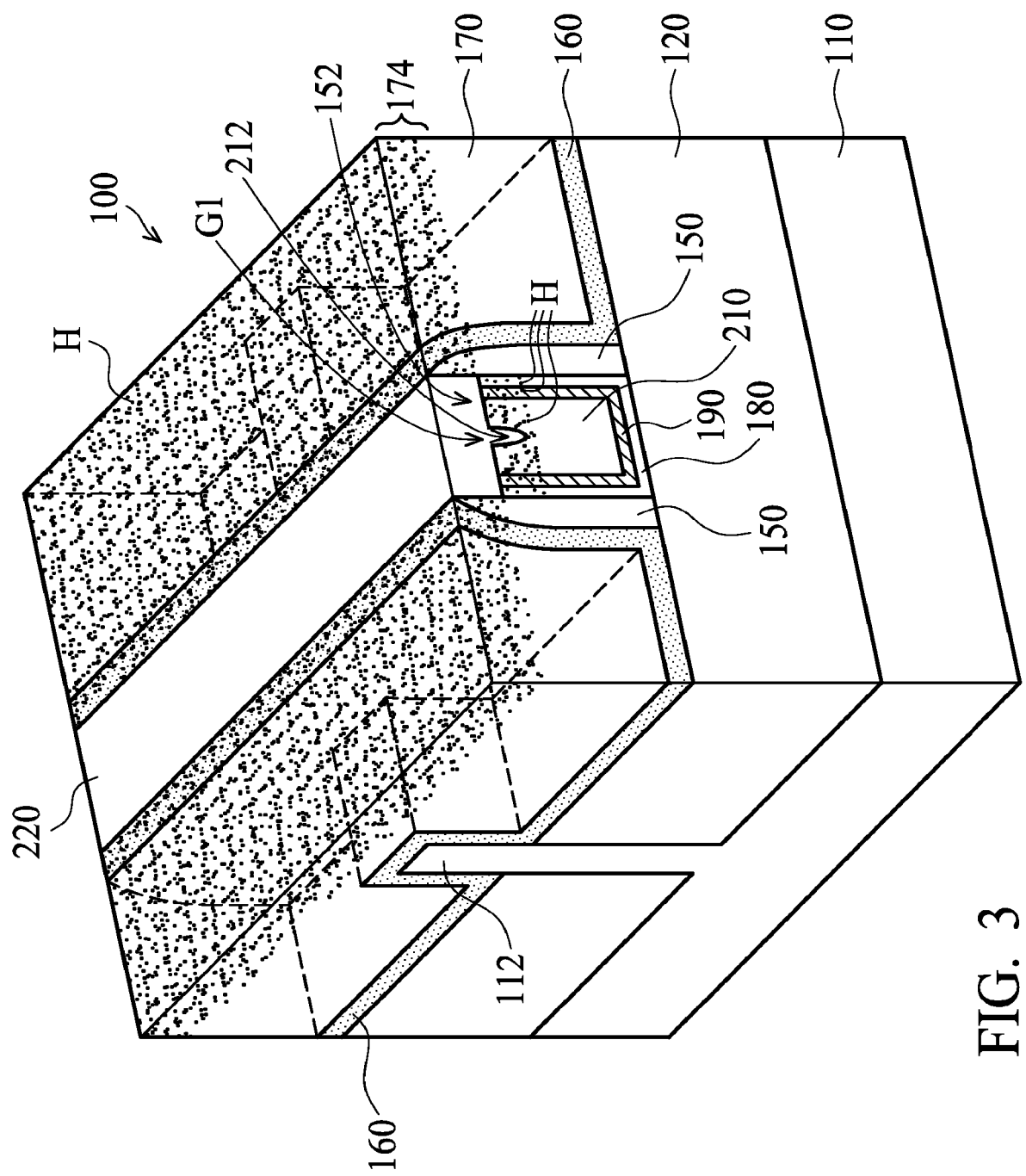
FIG. 3 is a perspective view of the semiconductor device structure of FIG. 2N, in accordance with some embodiments.

FIGS. 2A-2N are cross-sectional views of various stages of a process for forming a semiconductor device structure 100, in accordance with some embodiments. FIG. 3 is a perspective view of the semiconductor device structure 100 of FIG. 2N, in accordance with some embodiments.

After the stage of FIG. 2A, as shown in FIG. 2B, a spacer layer 150a is deposited over the isolation layer 120 to cover the dummy gate dielectric layer 130 and the dummy gate 140, in accordance with some embodiments. The spacer layer 150a includes an insulating material, such as silicon oxide or silicon nitride. The spacer layer 150a is formed using a chemical vapor deposition process, in accordance with some embodiments.

As shown in FIGS. 2B and 2C, an anisotropic etching process is performed to remove a portion of the spacer layer 150a, in accordance with some embodiments. The spacer layer 150a remaining over the sidewalls of the dummy gate 140 and the dummy gate dielectric layer 130 forms spacers 150, in accordance with some embodiments.

The spacers 150 are configured to electrically isolate a gate formed subsequently from other devices and configured to act as a mask layer in a subsequent ion implantation process, in accordance with some embodiments. The anisotropic etching process includes a dry etching process, in accordance with some embodiments.

As shown in FIG. 2C, heavily doped regions 114 are formed in the fin structure 112, in accordance with some embodiments. The heavily doped regions 114 are formed in the fin structure 112 exposed by the dummy gate 140 and the spacers 150, in accordance with some embodiments.

The heavily doped regions 114 are formed using an ion implantation process, in accordance with some embodiments. The ion implantation process uses the dummy gate 140 and the spacers 150 as an ion implantation mask, in accordance with some embodiments. The ion implantation process is performed to introduce p-type impurities (e.g., boron) or n-type impurities (e.g., phosphorus) into the fin structure 112, in accordance with some embodiments.

Two adjacent heavily doped regions 114 are a heavily doped source region and a heavily doped drain region, in accordance with some embodiments. The heavily doped regions 114 are located at the two opposite sides of the dummy gate 140, in accordance with some embodiments.

Thereafter, in some embodiments (not shown), stressors are formed in the heavily doped regions 114 by using suitable processes, in accordance with some embodiments. The suitable processes include, for example, an etching process for removing a portion of the fin structure 112 and a selective epitaxial growth (SEG) process. Depending on the desired type of the resulting FinFET device, either stressors applying a compressive stress to the channel region (such as SiGe stressors) or stressors applying a tensile stress to the channel region (such as SiC stressors) are formed.

As shown in FIG. 2C, an etch stop layer 160 is formed over the substrate 110 to cover the heavily doped regions 114, in accordance with some embodiments. The etch stop layer 160 further covers the dummy gate 140, the spacers 150, and the isolation layer 120, in accordance with some embodiments. The etch stop layer 160 includes a dielectric material, in accordance with some embodiments. The etch stop layer 160 includes silicon nitride, in accordance with some embodiments.

As shown in FIG. 2D, a dielectric layer 170 is deposited over the etch stop layer 160, in accordance with some embodiments. The dielectric layer 170 covers the isolation layer 120, the fin structure 112, the dummy gate 140, and the spacers 150, in accordance with some embodiments.

The dielectric layer 170 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 170 is deposited using a CVD process, a HDPCVD process, a spin-on process, a sputtering process, or a combination thereof, in accordance with some embodiments.

Afterwards, as shown in FIG. 2E, a planarization process is performed on the dielectric layer 170 until a top surface 142 of the dummy gate 140 is exposed, in accordance with some embodiments. The planarization process includes a chemical mechanical polishing (CMP) process, in accordance with some embodiments. After the planarization process is performed, the dielectric layer 170 has a substantially planar surface to facilitate subsequent process steps.

As shown in FIG. 2F, the dummy gate 140 is removed, in accordance with some embodiments. The removal process for removing the dummy gate 140 includes a wet etching process, a dry etching process, or a combination thereof, in accordance with some embodiments. In some embodiments, the dummy gate dielectric layer 130 is also removed.

After the dummy gate 140 and the dummy gate dielectric layer 130 are removed, a trench T1 is formed between the spacers 150, in accordance with some embodiments. The trench T1 exposes a portion of the fin structure 112, in accordance with some embodiments. The trench T1 has a width W1 ranging from about 10 nm to about 35 nm, in accordance with some embodiments. The width W1 ranges from about 15 nm to about 35 nm, in accordance with some embodiments.

As shown in FIG. 2G, a gate dielectric layer 180 is formed over a bottom surface B1 of the trench T1, in accordance with some embodiments. The gate dielectric layer 180 is further formed over an inner wall S1 of the trench T1, an upper surface 172 of the dielectric layer 170, and the spacers 150, in accordance with some embodiments.

The gate dielectric layer 180 includes a dielectric material, such as a high dielectric constant (high-k) material. The high-k material includes hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof, in accordance with some embodiments.

The gate dielectric layer 180 is deposited by any suitable process, such as atomic layer deposition (ALD), chemical vapor deposition (CVD), physical vapor deposition (PVD), sputtering, plating, other suitable processes, or a combination thereof, in accordance with some embodiments. In some embodiments, the gate dielectric layer 180 needs to be further annealed.

An intermediate dielectric layer (not shown) may be formed over the fin structure 112 before the gate dielectric layer 180 is formed. The intermediate dielectric layer includes a suitable dielectric material, such as silicon oxide, hafnium silicate, silicon oxynitride, or a combination thereof.

As shown in FIG. 2G, a work function layer 190 is deposited over the gate dielectric layer 180, in accordance with some embodiments. The work function layer 190 provides a desired work function for transistors to enhance device performance including improved threshold voltage.

In the embodiments of forming an N-type FinFET, the work function layer 190 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

On the other hand, in the embodiments of forming a P-type FinFET, the work function layer 190 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments.

For example, the p-type metal is made of titanium, titanium nitride, other suitable materials, or a combination thereof. The work function layer 190 includes aluminum, titanium, or a combination thereof, in accordance with some embodiments. The work function layer 190 is deposited using a PVD process, CVD process, ALD process, plating process, another suitable method, or a combination thereof, in accordance with some embodiments.

As shown in FIG. 2H, a gate electrode layer 210 (also called a metal gate electrode layer) is deposited over the work function layer 190 to fill the trench T1, in accordance with some embodiments. In some embodiments, the gate electrode layer 210 has a void 212 in the trench T1. The void 212 is a closed void, in accordance with some embodiments. The gate electrode layer 210 includes a suitable metal material, such as aluminum, tungsten, gold, platinum, cobalt, another suitable metal, an alloy thereof, or a combination thereof, in accordance with some embodiments.

The deposition process includes an atomic layer deposition (ALD) process and a chemical vapor deposition (CVD) process, in accordance with some embodiments. In some other embodiments, the gate electrode layer 210 is deposited using a PVD process, a plating process, the like, or a combination thereof.

As shown in FIG. 2I, the gate electrode layer 210, the work function layer 190, and the gate dielectric layer 180 outside of the trench T1 are removed, in accordance with some embodiments. The gate electrode layer 210 and the work function layer 190 remaining in the trench T1 together form a gate stack G1, in accordance with some embodiments.

The void 212 is opened by the removal process, in accordance with some embodiments. The removal process includes performing a planarization process, in accordance with some embodiments. The planarization process includes a chemical mechanical polishing (CMP) process, in accordance with some embodiments.

After the planarization process, residues R from the planarization process are formed over top surfaces 214, 192, 182, 162, and 172 of the gate electrode layer 210, the work function layer 190, the gate dielectric layer 180, the etch stop layer 160, and the dielectric layer 170, in accordance with some embodiments. The residues R are formed from the gate electrode layer 210, the work function layer 190, the gate dielectric layer 180, and the polishing slurry used in the planarization process, in accordance with some embodiments.

The residues R include a material of the gate electrode layer 210, the work function layer 190, the gate dielectric layer 180, and the polishing slurry, in accordance with some embodiments. The polishing slurry includes carbon, such as a polymer material, in accordance with some embodiments. The residues R include tungsten, aluminum, gold, platinum, cobalt, and/or carbon (from the polishing slurry), in accordance with some embodiments.

A portion of the residues R is in the void 212, in accordance with some embodiments. A portion of the residues R diffuses into the gate electrode layer 210 and the work function layer 190, in accordance with some embodiments. Since the etching selectivity ratio between metal and carbon is high, the residues R of carbon may hinder the etching process performed on the gate electrode layer 210 and the work function layer 190 subsequently.

As shown in FIG. 2J, a cleaning process is performed to remove the residues R, top portions of the gate electrode layer 210, the work function layer 190, and the gate dielectric layer 180, in accordance with some embodiments. After the cleaning process, a recess 152 is formed between the spacers 150 and the gate stack G1, in accordance with some embodiments. The recess 152 is surrounded by the spacers 150 (or the dielectric layer 170) and the gate stack G1, in accordance with some embodiments. The recess 152 is connected to the void 212, in accordance with some embodiments.

The cleaning process removes the residues R over the top surfaces 214, 192, 182, 162, and 172 and the residues R in the void 212, in accordance with some embodiments. Therefore, the cleaning process helps a subsequently-performed removal process for removing the residues R in the gate electrode layer 210 and the work function layer 190, in accordance with some embodiments. After the cleaning process, the residues R diffusing into the gate electrode layer 210 and the work function layer 190 and/or a portion of the residues R in the void 212 may remain.

Since the cleaning process removes the top portion of the gate electrode layer 210, the cleaning process may enlarge the opening 212a of the void 212 and reduce the depth D3 of the void 212. Therefore, the cleaning process helps a subsequently-performed removal process for removing the residues R in the void 212, in accordance with some embodiments.

The recess 152 has a depth D1 ranging from about 5 nm to about 30 nm, in accordance with some embodiments. A ratio of the depth D1 to a depth D2 of the trench T1 ranges from about 0.08 to about 0.5, in accordance with some embodiments. If the ratio (D1/D2) is less than 0.08, the opening 212a of the void 212 may be too small to remove the residues R in the void 212. If the ratio (D1/D2) is greater than 0.5, the thickness of the gate stack G1 may be too small to perform the subsequent process.

The cleaning process includes an etching back process, in accordance with some embodiments. The etching back process includes a dry etching process, in accordance with some embodiments. The dry etching process includes a plasma etching process, in accordance with some embodiments. The plasma etching process uses a process gas that includes fluorine and/or chlorine, in accordance with some embodiments.

As shown in FIG. 2K, a hydrogen-containing plasma process P is performed on the gate electrode layer 210, the work function layer 190, the gate dielectric layer 180, the spacers 150, the etch stop layer 160, and the dielectric layer 170, in accordance with some embodiments. The hydrogen-containing plasma process P uses a process gas includes $H_2$, in accordance with some embodiments.

Therefore, after the hydrogen-containing plasma process P, upper portions 216, 194, 184, 154, 164, and 174 of the gate electrode layer 210, the work function layer 190, the gate dielectric layer 180, the spacers 150, the etch stop layer 160, and the dielectric layer 170 are implanted with hydrogen atoms H, in accordance with some embodiments. The upper portions 216, 194, 184, 154, 164, and 174 also referred to as hydrogen-containing portions 216, 194, 184, 154, 164, and 174 of the gate electrode layer 210, the work function layer 190, the gate dielectric layer 180, the spacers 150, the etch stop layer 160, and the dielectric layer 170, in accordance with some embodiments.

The process gas further includes $N_2$, in accordance with some embodiments. Therefore, after the hydrogen-containing plasma process P, the hydrogen-containing portions 216, 194, 184, 154, 164, and 174 are further implanted with nitrogen atoms, in accordance with some embodiments.

In the hydrogen-containing plasma process P, the hydrogen atoms H penetrate into the gate electrode layer 210 and the work function layer 190 and are implanted into the void 212, in accordance with some embodiments. Therefore, the hydrogen atoms H react with the residues R of carbon in the gate electrode layer 210, the work function layer 190, and the void 212 to volatilize the residues R of carbon into a gaseous hydrocarbon compound (such as $CH_4$).

As a result, the residues R of carbon in the void 212, the gate electrode layer 210, and the work function layer 190 are reduced by the hydrogen-containing plasma process P, in accordance with some embodiments. Therefore, the hydrogen-containing plasma process P helps the etching process performed on the gate electrode layer 210 and the work function layer 190 subsequently.

Furthermore, since the cleaning process of FIG. 2J uses a process gas that includes chlorine, the chlorine atoms (not shown) may be in the gate electrode layer 210 and the work function layer 190. The hydrogen atoms H react with the chlorine atoms to volatilize the chlorine atoms into a gaseous chlorine compound (such as HCl), which reduces the defects in the gate electrode layer 210 and the work function layer 190 resulting from the chlorine atoms. Therefore, the hydrogen-containing plasma process P improves the electrical properties and the reliability of the gate electrode layer 210 and the work function layer 190, in accordance with some embodiments.

The hydrogen-containing plasma process P is performed at a processing temperature ranging from about 200° C. to about 400° C., in accordance with some embodiments. If the processing temperature ranging is lower than 200° C., the hydrogen atoms H may be unable to volatilize the residues R of carbon into the gaseous hydrocarbon compound. If the processing temperature ranging is higher than 400° C., the processing temperature may affect (or damage) the layers of the semiconductor device structure 100.

As shown in FIG. 2L, top portions of the gate dielectric layer 180, the work function layer 190, and the gate electrode layer 210 in the trench T1 are removed, in accordance with some embodiments. The gate stack G1 has a thickness TH1, in accordance with some embodiments.

The hydrogen-containing portions 216 and 194 of the gate electrode layer 210 and the work function layer 190 together form a hydrogen-containing portion U of the gate stack G1, in accordance with some embodiments. The hydrogen-containing portion U has a thickness TH2, in accordance with some embodiments. In some embodiments, a ratio of the thickness TH2 to the thickness TH1 ranges from about 0.3 to about 0.5.

In some embodiments, the first concentration of the hydrogen atoms H in the hydrogen-containing portion U is greater than the second concentration of the hydrogen atoms H in a lower portion L of the gate stack G1. In some embodiments, a ratio of the first concentration to the second concentration ranges from about 2 to 100.

The removal process includes an etching process, in accordance with some embodiments. The etching process includes an anisotropic etching process, such as a dry etching process, in accordance with some embodiments. The dry etching process includes a plasma etching process, in accordance with some embodiments. The plasma etching process uses a process gas that includes fluorine and/or chlorine, in accordance with some embodiments.

Since the cleaning process removes the residues R (as shown in FIG. 2J), the cleaning process improves the yield of the removal process of FIG. 2L, in accordance with some embodiments. Since the residues R of carbon in the gate stack G1 are removed by the hydrogen-containing plasma process P (as shown in FIG. 2K), the hydrogen-containing plasma process P may improves the electrical properties of the gate stack G1 and the etching of the work function layer 190 and/or the gate electrode layer 210 of FIG. 2L.

As shown in FIG. 2M, a cap layer 220 is formed over the gate stack G1 to fill the recess 152 and the void 212, in accordance with some embodiments. The cap layer 220 covers the gate stack G1, the spacers 150, the etch stop layer 160, and the dielectric layer 170, in accordance with some embodiments. The cap layer 220 includes an insulating material, in accordance with some embodiments.

The cap layer 220 and the dielectric layer 170 are made of different material, in accordance with some embodiments. The cap layer 220 includes silicon nitride, in accordance with some embodiments. The cap layer 220 is formed by a CVD process, a PVD process, or another suitable process. The cap layer 220 is configured to prevent contacts from shorting with the gate stack G1, in accordance with some embodiments.

As shown in FIGS. 2N and 3, the cap layer 220 outside of the recess 152 is removed, in accordance with some embodiments. The removal process includes performing a planarization process, in accordance with some embodiments. The planarization process includes a chemical mechanical polishing (CMP) process, in accordance with some embodiments. After the planarization process, a top surface 222 of the cap layer 220, a top surface 162 of the etch stop layer 160, and the top surface 172 of the dielectric layer 170 are aligned with each other, in accordance with some embodiments.

The hydrogen-containing portion U of the gate stack G1 is under and adjacent to the cap layer 220, in accordance with some embodiments. The hydrogen-containing portion U is between the lower portion L and the cap layer 220, in accordance with some embodiments. The void 212 is in the hydrogen-containing portion U, in accordance with some embodiments. The cap layer 220 is filled into the void 212, in accordance with some embodiments. The hydrogen-containing portion 174 of the dielectric layer 170 surrounds the cap layer 220, in accordance with some embodiments. The hydrogen-containing portions U and 174 both contain nitrogen atoms and hydrogen atoms, in accordance with some embodiments.

The gate stack G1 contains less than 10 mol % of carbon, in accordance with some embodiments. The gate stack G1 contains from about 0.01 mol % of carbon to about 9 mol % of carbon, in accordance with some embodiments. If the gate stack contains greater than 10 mol % of carbon, the electrical properties of the gate stack may be negatively affected.

The gate stack G1 contains less than 2 mol % of chlorine, in accordance with some embodiments. The gate stack G1 contains from about 0.01 mol % of chlorine to about 1.5 mol % of chlorine, in accordance with some embodiments. If the gate stack contains greater than 2 mol % of chlorine, the electrical properties of the gate stack may be negatively affected.

Figure 4:
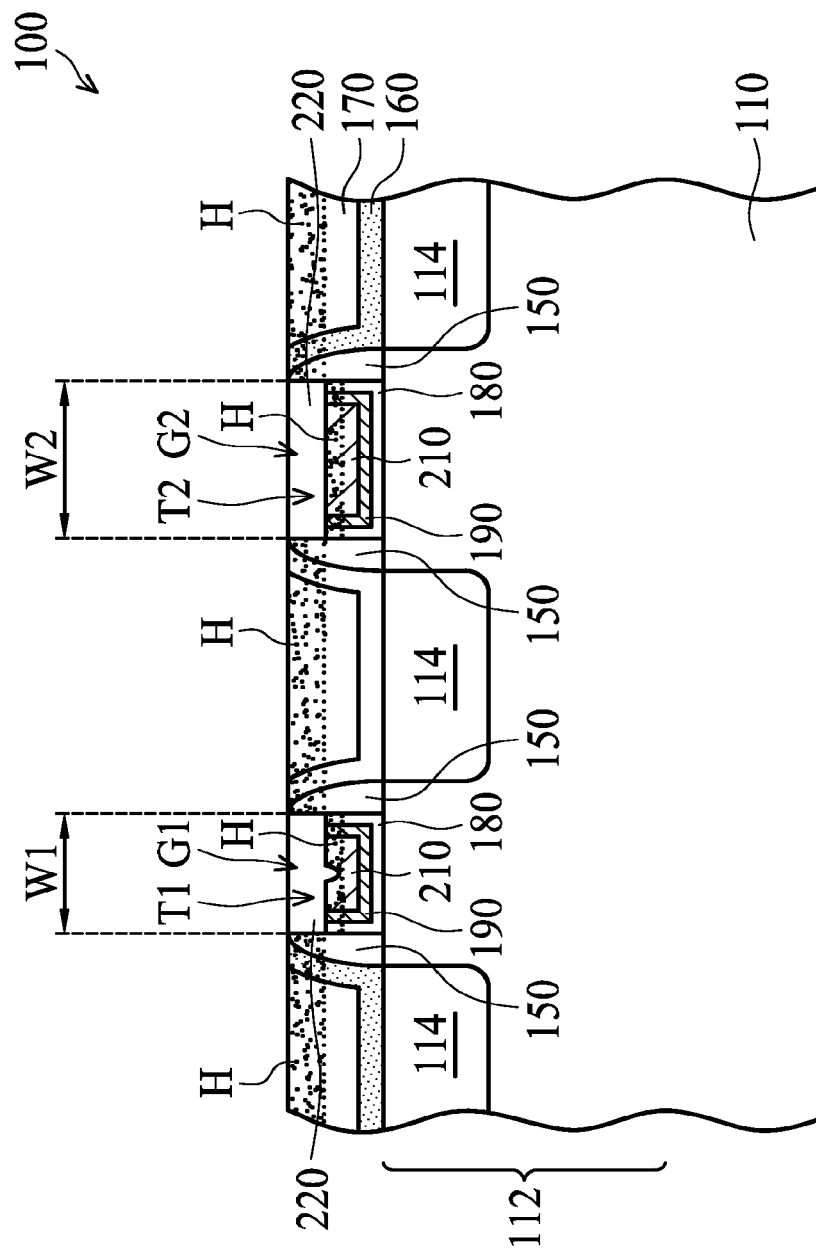
FIG. 4 is a cross-sectional view of a semiconductor device structure, in accordance with some embodiments.

FIG. 4 is a cross-sectional view of a semiconductor device structure, in accordance with some embodiments. The method of FIGS. 1A-3 may form more than one gate stack over the substrate 110. For example, as shown in FIG. 4, a gate stack G2 is formed adjacent to the gate stack G1, in accordance with some embodiments.

In some embodiments, spacers 150 surround the gate stack G2. In some embodiments, a gate dielectric layer 180 is formed between the gate stack G2 and the substrate 110 and between the gate stack G2 and the spacers 150. In some embodiments, the etch stop layer 160 covers the spacers 150. In some embodiments, a trench T2 is formed between the spacers 150, and the gate stack G2 is in the trench T2. In some embodiments, a width W2 of the trench T2 is greater than the width W1 of the trench T1. In some embodiments, a difference between the width W2 and the width W1 ranges from about 2 nm to about 10 nm.

The cleaning process and the hydrogen-containing plasma process reduce the residues of carbon, which prevents the residues of carbon from blocking the narrow trench T1 and hindering the etching process on the gate stack G1. Therefore, the removal process of FIG. 2L removes top portions of the gate dielectric layer 180, the work function layer 190, and the gate electrode layer 210 substantially equally in the narrow trench T1 and the wide trench T2 of FIG. 4, in accordance with some embodiments. As a result, the cap layer 220 in the narrow trench T1 has an enough thickness to prevent contacts from shorting with the gate stack G1.

In accordance with some embodiments, semiconductor device structures and methods for forming the same are provided. After a planarization process for forming a gate stack, the methods (for forming the semiconductor device structure) perform a cleaning process to remove residues resulting from the planarization process and to remove a top portion of the gate stack. The cleaning process may enlarge an opening of a void formed in the gate stack and reduce the depth of the void to help the removal of the residues in the void in subsequent processes.

Thereafter, the methods perform a hydrogen-containing plasma process to volatilize the residues of carbon into a gaseous hydrocarbon compound so as to reduce the residues of carbon, especially the residues in the void and the gate stack. Therefore, the hydrogen-containing plasma process helps the etching process performed on the gate stack subsequently.

In accordance with some embodiments, a method for forming a semiconductor device structure is provided. The method includes forming a dielectric layer over a substrate. The dielectric layer has a trench passing through the dielectric layer. The method includes forming a gate stack in the trench. The method includes performing a hydrogen-containing plasma process over the gate stack. The method includes removing a top portion of the gate stack to form a first recess surrounded by the gate stack and the dielectric layer. The method includes forming a cap layer in the first recess.

In accordance with some embodiments, a method for forming a semiconductor device structure is provided. The method includes forming a dielectric layer over a substrate. The dielectric layer has a trench passing through the dielectric layer. The method includes forming a gate stack in the trench. The gate stack has a void. The method includes performing a hydrogen-containing plasma process over the gate stack to remove residues of carbon over the gate stack and in the void. The method includes removing a top portion of the gate stack to form a first recess surrounded by the gate stack and the dielectric layer. The method includes forming a cap layer in the first recess to fill the first recess and the void.

In accordance with some embodiments, a semiconductor device structure is provided. The semiconductor device structure includes a substrate. The semiconductor device structure includes a dielectric layer over the substrate. The dielectric layer has a trench passing through the dielectric layer. The semiconductor device structure includes a gate stack in the trench. A recess is surrounded by the gate stack and the dielectric layer. The semiconductor device structure includes a cap layer in the recess. The gate stack has a first hydrogen-containing portion adjacent to the cap layer.

In accordance with some embodiments, a device includes a semiconductor substrate; a gate stack over the semiconductor substrate, wherein the gate stack comprises a gate electrode a first hydrogen-containing portion in the gate electrode; one or more gate spacers adjacent the gate stack and comprising a second hydrogen-containing portion, wherein the second hydrogen-containing portion extends above the first hydrogen-containing portion; and an insulating cap layer over the gate electrode. The first hydrogen-containing portion is disposed around a first portion of the insulating cap layer, and the second hydrogen-containing portion is disposed around a second portion of the insulating cap layer.

In accordance with some embodiments, a device includes a semiconductor substrate; a first gate electrode over the semiconductor substrate, wherein the first gate electrode comprises a first hydrogen-containing portion; a first insulating cap layer on the first gate electrode; a second gate electrode over the semiconductor substrate; and a second insulating cap layer on the second gate electrode. The second gate electrode comprises a second hydrogen-containing portion, and a top surface of the first gate electrode has a different profile than a top surface of the second gate electrode.

In accordance with some embodiments, a device includes a substrate, a dielectric layer over the substrate, a first gate stack in the dielectric layer, and a first cap layer over the first gate stack. The first gate stack has a first hydrogen-containing portion at an interface between the first gate stack and the first cap layer. A bottommost surface of the first cap layer is below a topmost surface of the first gate stack. The device further includes a gate spacer between the first gate stack and the dielectric layer. The gate spacer has a second hydrogen-containing portion. A topmost surface of the second hydrogen-containing portion is spaced apart from a major surface of the substrate by a greater distance than a topmost surface of the first hydrogen-containing portion.

In accordance with some embodiments, a device includes a semiconductor substrate and a gate stack over the semiconductor substrate. The gate stack includes a gate electrode and a first hydrogen-containing portion in the gate electrode. The device further includes one or more gate spacers adjacent the gate stack and comprising a second hydrogen-containing portion. A topmost surface of the second hydrogen-containing portion is spaced apart from a topmost surface of the semiconductor substrate by a greater distance than a topmost surface of the first hydrogen-containing portion. A bottommost surface of the second hydrogen-containing portion is spaced apart from the topmost surface of the semiconductor substrate by a greater distance than a bottommost surface of the first hydrogen-containing portion.

In accordance with some embodiments, a device includes a semiconductor substrate and a first gate electrode over the semiconductor substrate. The first gate electrode comprises a first hydrogen-containing portion. The device further includes a first insulating cap layer on the first gate electrode. A bottommost surface of the first insulating cap layer is below a topmost surface of the first gate electrode. The device further includes a dielectric layer surrounding the first insulating cap layer. The dielectric layer has a second hydrogen-containing portion. The second hydrogen-containing portion is above the first hydrogen-containing portion. The device further includes a spacer between the first insulating cap layer and the dielectric layer. The spacer has a third hydrogen-containing portion. The third hydrogen-containing portion is level with the second hydrogen-containing portion.

In accordance with some embodiments, a method includes forming a dielectric layer over a substrate. The dielectric layer having a recess extends through the dielectric layer. A gate electrode is formed in the recess. A first portion of the gate electrode is removed. Hydrogen atoms are implanted into the gate electrode and the dielectric layer. A second portion of the gate electrode is removed. A cap layer is formed over a remaining portion of the gate electrode. A bottommost surface of the cap layer is below a topmost surface of the remaining portion of the gate electrode.

In accordance with some embodiments, a method includes forming a dummy gate stack over a substrate. A spacer is formed along a sidewall of the dummy gate stack. A dielectric layer is formed over the substrate, the dummy gate stack and the spacer. The dummy gate stack is removed to form a recess. A gate electrode is formed in the recess. The gate electrode has a void within the recess. A first etch process is performed to recess the gate electrode below a topmost surface of the dielectric layer to a first depth. The first etch process removes a first portion of the void. An implantation process is performed on the gate electrode, the spacer and the dielectric layer. The implantation process implants hydrogen atoms into the gate electrode, the spacer and the dielectric layer. A second etch process is performed to recess the gate electrode below the top surface of the dielectric layer to a second depth greater than the first depth. The second etch process removes a second portion of the void. An insulating material is deposited over the gate electrode. The insulating material fills a remaining portion of the void.

In accordance with some embodiments, a device includes a substrate, a dielectric layer over the substrate, a gate electrode in the dielectric layer, and a cap layer over the gate electrode. The dielectric layer has a first hydrogen-containing portion. The gate electrode has a second hydrogen-containing portion at an interface between the gate electrode and the cap layer. A bottommost surface of the cap layer is below a topmost surface of the gate electrode. A topmost surface of the first hydrogen-containing portion is spaced apart from a major surface of the substrate by a greater distance than a topmost surface of the second hydrogen-containing portion. A bottommost surface of the first hydrogen-containing portion is spaced apart from the major surface of the substrate by a greater distance than a bottommost surface of the second hydrogen-containing portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over a substrate, the dielectric layer having a recess extending through the dielectric layer;
   forming a gate electrode in the recess;
   removing a first portion of the gate electrode;
   implanting hydrogen atoms into the gate electrode and the dielectric layer;
   implanting nitrogen atoms into the gate electrode and the dielectric layer;
   removing a second portion of the gate electrode; and
   forming a cap layer over a remaining portion of the gate electrode, wherein a bottommost surface of the cap layer is below a topmost surface of the remaining portion of the gate electrode.

2. The method of claim 1, wherein removing the first portion of the gate electrode comprises performing a cleaning process on the gate electrode.

3. The method of claim 1, wherein implanting the hydrogen atoms into the gate electrode and the dielectric layer comprises performing a hydrogen-containing plasma process.

4. The method of claim 1, wherein removing the second portion of the gate electrode comprises performing an etch process on the gate electrode.

5. The method of claim 1, wherein after forming the gate electrode in the recess, the gate electrode comprises a void within the recess.

6. The method of claim 1, wherein the dielectric layer and the cap layer comprise different materials.

7. The method of claim 5, wherein removing the first portion and the second portion of the gate electrode comprises removing portions of the void, and wherein forming the cap layer over the remaining portion of the gate electrode comprises filling a remaining portion of the void with the capping layer.

8. A method comprising:
forming a dummy gate stack over a substrate;
forming a spacer along a sidewall of the dummy gate stack;
forming a dielectric layer over the substrate, the dummy gate stack and the spacer;
removing the dummy gate stack to form a recess;
forming a gate electrode in the recess, the gate electrode having a void within the recess;
performing a first etch process to recess the gate electrode below a topmost surface of the dielectric layer to a first depth, the first etch process removing a first portion of the void;
performing an implantation process on the gate electrode, the spacer and the dielectric layer, the implantation process implanting hydrogen atoms into the gate electrode, the spacer and the dielectric layer;
performing a second etch process to recess the gate electrode below the top surface of the dielectric layer to a second depth greater than the first depth, the second etch process removing a second portion of the void; and
depositing an insulating material over the gate electrode, the insulating material filling a remaining portion of the void.

9. The method of claim 8, wherein the recess has a third depth, and wherein a ratio of the first depth to the third depth is between bout 0.08 and about 0.5.

10. The method of claim 8, wherein the first etch process is different from the second etch process.

11. The method of claim 8, wherein the implantation process further implants nitrogen atoms into the gate electrode, the spacer and the dielectric layer.

12. The method of claim 11, wherein performing the implantation process comprises performing a plasma process.

13. The method of claim 12, wherein the plasma process is performed using a process gas comprising $H_2$ and $N_2$.

14. The method of claim 8, wherein a topmost surface of the dielectric layer is level with a topmost surface of the insulating material.

15. A method comprising:
forming a dielectric layer over a substrate, the dielectric layer having a recess extending through the dielectric layer;
forming a gate electrode layer in the recess and over a top surface of the dielectric layer, the gate electrode layer having a void within the recess;
performing a planarization process on the gate electrode layer to expose the top surface of the dielectric layer, wherein the planarization process opens the void and forms first residues in the void and second residues within the gate electrode layer;
performing a cleaning process on the gate electrode layer to remove the first residues, wherein the cleaning process further removes a first portion of the gate electrode layer and reduces a depth of the void;
implanting hydrogen atoms into the gate electrode layer and the dielectric layer, wherein the hydrogen atoms react with the second residues to form a volatile compound;
performing an etch process on the gate electrode layer to remove a second portion of the gate electrode layer and further reduce the depth of the void; and
forming a cap layer over a remaining portion of the gate electrode layer, wherein the cap layer fills a remaining portion of the void.

16. The method of claim 15, wherein the first residues and the second residues comprise a material of a slurry used in the planarization process.

17. The method of claim 15, wherein the second residues comprise carbon and the volatile compound comprises a gaseous hydrocarbon compound.

18. The method of claim 15, wherein the dielectric layer and the cap layer comprise different materials.

19. The method of claim 15, wherein implanting the hydrogen atoms into the gate electrode layer and the dielectric layer comprises performing a hydrogen-containing plasma process.

20. The method of claim 15, further comprising implanting nitrogen atoms into the gate electrode layer and the dielectric layer.

* * * * *